US012613216B2

(12) United States Patent
Hamasaki et al.

(10) Patent No.: US 12,613,216 B2
(45) Date of Patent: Apr. 28, 2026

(54) GAS SENSOR SYSTEM

(71) Applicant: KABUSHIKI KAISHA TOSHIBA,
Tokyo (JP)

(72) Inventors: Hiroshi Hamasaki, Hiratsuka
Kanagawa (JP); Yoshiaki Sugizaki,
Fujisawa Kanagawa (JP); **Hideyuki
Tomizawa,** Ota Gumma (JP)

(73) Assignee: KABUSHIKI KAISHA TOSHIBA,
Tokyo (JP)

( * ) Notice: Subject to any disclaimer, the term of this
patent is extended or adjusted under 35
U.S.C. 154(b) by 714 days.

(21) Appl. No.: 18/171,886

(22) Filed: Feb. 21, 2023

(65) Prior Publication Data

US 2024/0077451 A1 Mar. 7, 2024

(30) Foreign Application Priority Data

Sep. 6, 2022 (JP) ................................. 2022-141584

(51) Int. Cl.
*G01N 27/414* (2006.01)
*H10D 62/80* (2025.01)

(52) U.S. Cl.
CPC ....... *G01N 27/4141* (2013.01); *H10D 62/882*
(2025.01)

(58) Field of Classification Search
None
See application file for complete search history.

(56) References Cited

U.S. PATENT DOCUMENTS

2021/0093990 A1    4/2021  Akasaka et al.
2022/0260540 A1 *  8/2022  Yoshikawa ........ G01N 33/0036
2022/0276200 A1 *  9/2022  Sugizaki ............ G01N 27/4146

FOREIGN PATENT DOCUMENTS

JP      H11174035 A   *  7/1999
JP      200074878 A       3/2000
JP      2000074878 A  *  3/2000
JP      3385248 B2      12/2002
JP      2005038647 A  *  2/2005
JP      4072662 B2       2/2008

(Continued)

OTHER PUBLICATIONS

Hayasaka et al., "The influences of temperature, humidity, and O2
on electrical properties of graphene FETs", Sensors and Actuators
B: Chrmical, vol. 285 (2019) 116-122, 7 pages.

*Primary Examiner* — P. Kathryn Wright
(74) *Attorney, Agent, or Firm* — Maier & Maier, PLLC

(57) ABSTRACT

A gas sensor system includes a first pipe through which a
specimen atmosphere is conveyed; a second pipe through
which humidified air is conveyed, the humidified air being
hotter and more humid than the specimen atmosphere, the
humidified air having a lower water vapor pressure than a
saturation water vapor pressure; a mixing device mixing the
specimen atmosphere and the humidified air so that a water
vapor pressure of mixed air of the specimen atmosphere and
the humidified air is less than a saturation water vapor
pressure; a third pipe connected with the mixing device; a
cooling device cooling the mixed air conveyed through the
third pipe so that the water vapor pressure of the mixed air
becomes the saturation water vapor pressure; and a chemical
sensor device including a sensor surface to which the mixed
air cooled by the cooling device is supplied.

11 Claims, 2 Drawing Sheets

(56)     References Cited

FOREIGN PATENT DOCUMENTS

| JP | 4275523 B2 | 3/2009 | |
| WO | WO-2020066308 A1 * | 4/2020 | .............. G01N 1/00 |
| WO | 2020121703 A1 | 6/2020 | |

* cited by examiner

GAS SENSOR SYSTEM

CROSS-REFERENCE TO RELATED APPLICATION

This application is based upon and claims the benefit of priority from Japanese Patent Application No. 2022-141584, filed on Sep. 6, 2022; the entire contents of which are incorporated herein by reference.

FIELD

Embodiments described herein relate generally to a gas sensor system.

BACKGROUND

For example, when a sensor element that uses graphene is used as a gas sensor, the electrical or chemical response of the sensor element is prone to large fluctuations due to the effects of the humidity of the specimen atmosphere. This affects the detection accuracy of a target substance in the specimen atmosphere.

DETAILED DESCRIPTION

Figure 1:
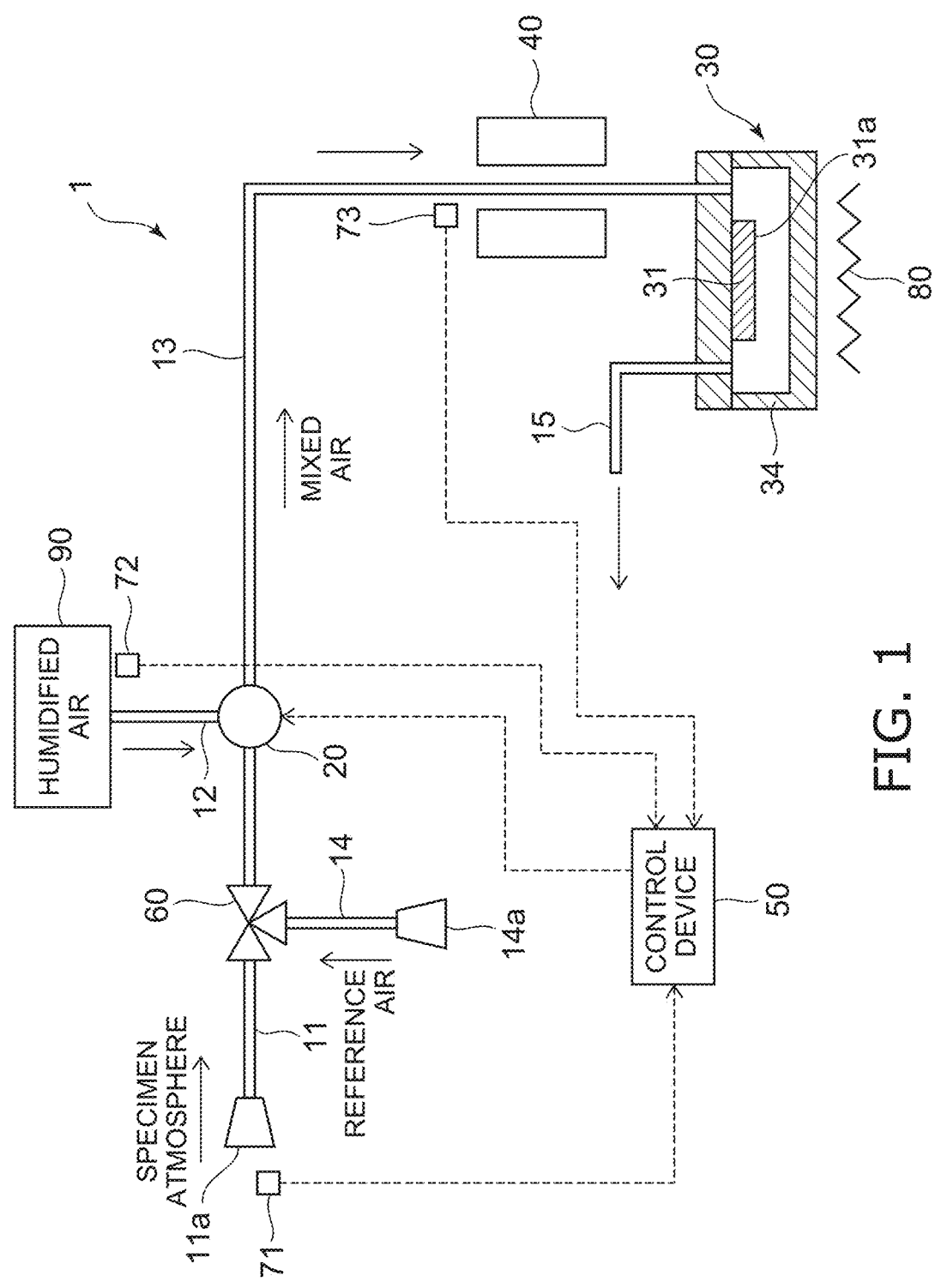
FIG. 1 is a schematic view showing a configuration of a gas sensor system of an embodiment.

According to one embodiment, a gas sensor system includes a first pipe through which a specimen atmosphere is conveyed; a second pipe through which humidified air is conveyed, the humidified air being hotter and more humid than the specimen atmosphere, the humidified air having a lower water vapor pressure than a saturation water vapor pressure; a mixing device connected with the first and second pipes, the mixing device mixing the specimen atmosphere and the humidified air so that a water vapor pressure of mixed air of the specimen atmosphere and the humidified air is less than a saturation water vapor pressure; a third pipe connected with the mixing device, the mixed air being conveyed through the third pipe; a cooling device cooling the mixed air conveyed through the third pipe so that the water vapor pressure of the mixed air becomes the saturation water vapor pressure; and a chemical sensor device connected with the third pipe, the chemical sensor device including a sensor surface to which the mixed air cooled by the cooling device is supplied.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

The same or similar components are marked with the same reference numerals.

As shown in FIG. 1, a gas sensor system 1 of an embodiment includes at least a first pipe 11, a second pipe 12, a third pipe 13, a mixing device 20, a cooling device 40, and a chemical sensor device 30.

The first pipe 11 includes a first collection port 11a. The specimen atmosphere is drawn into the first pipe 11 through the first collection port 11a. The specimen atmosphere is, for example, air.

The second pipe 12 is connected to a humidifying device 90. Humidified air is supplied from the humidifying device 90 to the second pipe 12. The humidified air is hotter and more humid than the specimen atmosphere and has a lower water vapor pressure than the saturation water vapor pressure. For example, a bubbling device or a spray device can be used as the humidifying device 90. The humidifying device 90 can include a heater that heats the humidified air or maintains the humidified air at a prescribed temperature.

The first pipe 11 and the second pipe 12 are connected to the mixing device 20. The gas sensor system 1 further includes a control device 50. Under the control of the control device 50, the mixing device 20 mixes the specimen atmosphere conveyed through the first pipe 11 and the humidified air conveyed through the second pipe 12 to have a prescribed mixing ratio so that the water vapor pressure of the mixed air of the specimen atmosphere and the humidified air is less than the saturation water vapor pressure.

The mixed air of the specimen atmosphere and the humidified air is conveyed through the third pipe 13 connected to the mixing device 20.

The third pipe 13 is connected to the chemical sensor device 30. The cooling device 40 is located at the third pipe 13 at the vicinity of the connection part with the chemical sensor device 30. A first distance along the third pipe 13 between the cooling device 40 and the chemical sensor device 30 is less than a second distance along the third pipe 13 between the cooling device 40 and the mixing device 20. The cooling device 40 cools the mixed air conveyed through the third pipe 13 directly before the mixed air is supplied to the chemical sensor device 30 so that the water vapor pressure of the mixed air becomes the saturation water vapor pressure. For example, a Peltier element can be used as the cooling device 40. A pipe through which a liquid such as water or the like flows may be wound around the third pipe 13 as the cooling device 40.

The chemical sensor device 30 includes a sensor element 31. The chemical sensor device 30 also includes an enclosure 34 housing the sensor element 31. The mixed air that is cooled by the cooling device 40 and has a water vapor pressure of not more than the saturation water vapor pressure is supplied to a sensor surface 31a of the sensor element 31 via the third pipe 13 communicating with the interior of the enclosure 34.

Figure 2A:
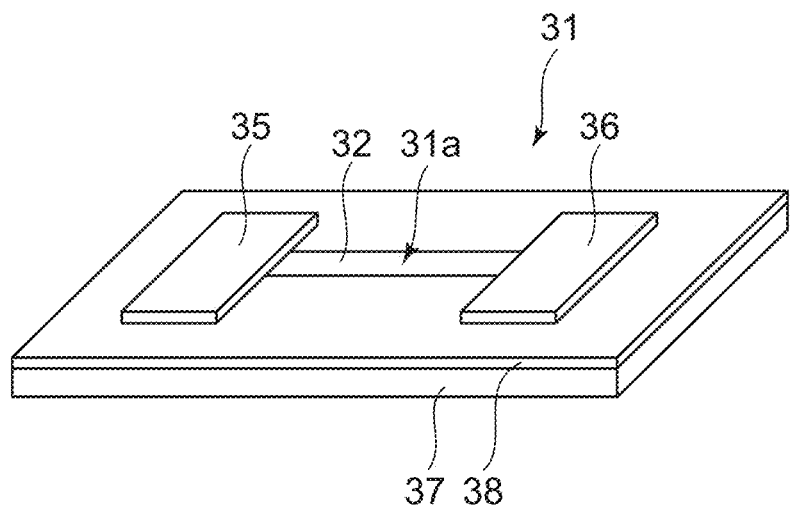
FIG. 2A is a schematic view of a sensor element of the embodiment.

The sensor element 31 is, for example, a graphene FET (field effect transistor) sensor; and the sensor surface 31a includes graphene. As shown in FIG. 2A, the sensor element 31 includes a substrate 37, graphene 32 supported on the substrate 37, a first electrode 35, and a second electrode 36.

The substrate 37 is, for example, a silicon substrate. For example, the graphene 32 is located on the substrate 37 with a foundation film 38 interposed. For example, a silicon oxide film can be used as the foundation film 38. The foundation film 38 can have the function of a chemical catalyst for forming the graphene 32.

One of the first electrode 35 or the second electrode 36 functions as a drain electrode; and the other functions as a source electrode. The first electrode 35 and the second electrode 36 electrically contact the graphene 32. A current flows between the first electrode 35 and the second electrode 36 via the graphene 32.

Figure 2B:
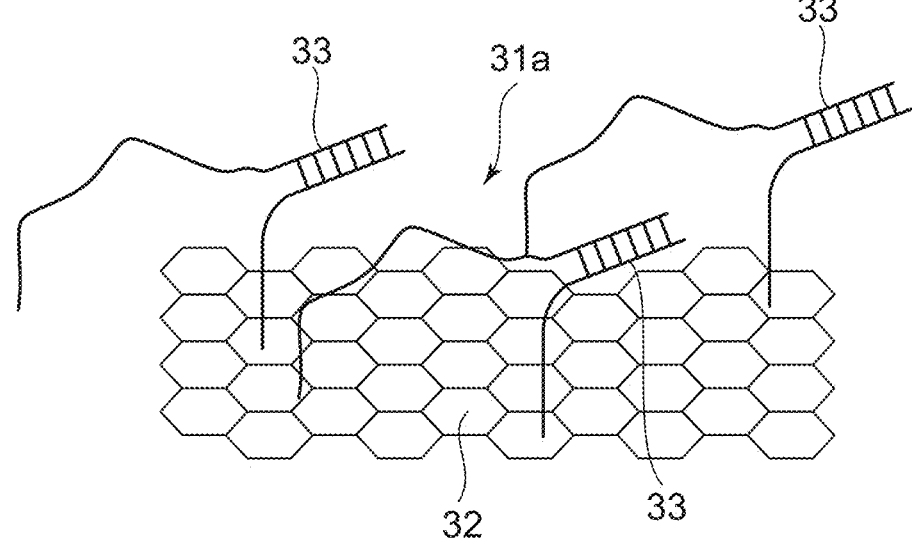
FIG. 2B is a schematic view of the sensor surface of the sensor element.

As shown in FIG. 2B, the sensor surface 31a can further include a probe molecule 33 formed at the graphene 32. The probe molecule 33 is bound, adsorbed, or proximate to the graphene 32 due to a chemical or charge-induced attraction, a hydrophobic interaction, etc.; and the probe molecule 33 is constrained to the surface of the graphene 32. Any substance that can bind to the target substance such as, for example, a protein, peptide, antibody, DNA aptamer, derivatives of these substances, etc., can be used as the probe molecule 33.

When the probe molecule 33 recognizes or captures the target substance, the target substance approaches the surface of the graphene 32 and thereby changes the electron state of the graphene 32 due to the charge of the target substance and/or a structural change of the probe molecule 33 due to the capture of the target substance. The presence and concentration of the target substance in the specimen atmosphere can be known by detecting the change of the electron state as a change of the current flowing between the first electrode 35 and the second electrode 36. Also, by applying an appropriate bias voltage to the substrate 37, the sensor element 31 can be operated at an operating point having a large current change rate.

An exhaust pipe 15 is connected to the chemical sensor device 30. The exhaust pipe 15 communicates with the interior of the enclosure 34. For example, a flow of the gas from the first and second pipes 11 and 12 to the exhaust pipe 15 via the third pipe 13 and the interior of the enclosure 34 is formed by driving a vacuum pump connected to the exhaust pipe 15. By causing the flow of the gas, condensation does not easily occur in the interior of the chemical sensor device 30 even when the mixed air cooled by the cooling device 40 includes micro condensate. Condensation means water vapor that becomes a water droplet on a surface of a solid substance. The sensor element 31 is positioned inside the enclosure 34 at a portion between the connection part between the exhaust pipe 15 of the chemical sensor device 30 and the connection part between the third pipe 13 of the chemical sensor device 30.

The specimen atmosphere that is drawn into the first pipe 11 is mixed in the mixing device 20 with the humidified air conveyed through the second pipe 12. The mixed air flows through the third pipe 13 toward the chemical sensor device 30 and is cooled by the cooling device 40 directly before being supplied to the chemical sensor device 30. The cooled mixed air is supplied to the sensor surface 31a of the chemical sensor device 30. When the target substance is included in the specimen atmosphere, the target substance can be detected by a change of the electrical characteristics of the sensor element 31, etc. The mixed air that is supplied to the chemical sensor device 30 is exhausted from the exhaust pipe 15.

The specimen atmosphere is mixed with the humidified air that is hotter and more humid than the specimen atmosphere and has a lower water vapor pressure than the saturation water vapor pressure. The mixing device 20 mixes the specimen atmosphere and the humidified air at a prescribed mixing ratio so that the water vapor pressure of the mixed air of the specimen atmosphere and the humidified air is less than the saturation water vapor pressure.

As an example, 1 L of the humidified air is mixed with 4 L of the specimen atmosphere, the temperature of the specimen atmosphere is 20° C., the humidity of the specimen atmosphere is 0% RH, the water vapor pressure of the specimen atmosphere is 0 hPa, the temperature of the humidified air is 70° C., the humidity of the humidified air is 61% RH, and the water vapor pressure of the humidified air is 190 hPa (the saturation water vapor pressure at 70° C.

being 312 hPa), so that the mixed air has a temperature of 29° C. and a water vapor pressure of 38 hPa. The saturation water vapor pressure at 29° C. is 40 hPa, and the water vapor pressure of the mixed air is slightly less than the saturation water vapor pressure.

After being conveyed through the third pipe 13 toward the chemical sensor device 30, the mixed air is cooled by the cooling device 40 so that the water vapor pressure of the mixed air becomes the saturation water vapor pressure. For example, the temperature of the mixed air in the example above is cooled from 29° C. to 25° C. The saturation water vapor pressure of the mixed air at 25° C. is 32 hPa. In other words, in the example above, 6 hPa of water vapor condenses after cooling, and the water vapor pressure of the mixed air after cooling is saturated. Accordingly, even when the specimen atmosphere drawn into the first pipe 11 is dry, the specimen atmosphere is supplied to the sensor surface 31a in a state in which the humidity is substantially constant (a relative humidity of 100% at the temperature after cooling); therefore, the effects of the humidity are suppressed, and a response of an electrical characteristic or the like of the sensor element 31 that is dependent on the presence and concentration of the target substance is obtained.

The water vapor pressure of the mixed air is maintained at less than the saturation water vapor pressure until being cooled directly before the sensor element 31; therefore, the mixed air that includes the specimen atmosphere can be conveyed proximate to the sensor element 31 while preventing condensation. Thereby, the target substance can be prevented from contacting and being assimilated into water. As a result, the detection sensitivity of the target substance by the sensor element 31 can be increased.

The water vapor pressure of the mixed air is dependent on the temperature and humidity of the specimen atmosphere that is drawn in. The water vapor pressure of the mixed air is more easily controlled by adjusting the mixing ratio of the specimen atmosphere and the humidified air than by adjusting the temperature and/or humidity of the humidified air according to the temperature and humidity of the specimen atmosphere. It is therefore favorable to include a first temperature-humidity sensor 71 that measures the temperature and humidity of the specimen atmosphere, and for the control device 50 to control the mixing ratio of the specimen atmosphere and the humidified air of the mixing device 20 based on a measured value of the first temperature-humidity sensor 71. For example, the control device 50 can include a memory device that stores data of mixing ratios corresponding to temperatures and humidity of the specimen atmosphere, and can control the measurement results of the temperature and humidity to have the mixing ratio obtained by referring to the data.

Also, the control precision of the water vapor pressure of the mixed air can be increased by including a second temperature-humidity sensor 72 that measures the temperature and humidity of the humidified air, and by the control device 50 controlling the mixing ratio of the specimen atmosphere and the humidified air based on a measured value of the first temperature-humidity sensor 71 and a measured value of the second temperature-humidity sensor 72.

Also, the control precision of the water vapor pressure of the mixed air can be further increased by including a third temperature-humidity sensor 73 that measures the temperature and humidity of the mixed air before being cooled by the cooling device 40, and by the control device 50 feeding back a measured value of the third temperature-humidity sensor 73 to the control of the mixing ratio of the specimen atmosphere and the humidified air.

It is favorable to further include a heating device 80 that heats the chemical sensor device 30 to prevent condensation in the interior of the enclosure 34. For example, the temperature of the chemical sensor device 30 is heated by the heating device 80 to about 30° C. The heating device 80 heats the chemical sensor device 30 to a temperature greater than the temperature of the mixed air cooled by the cooling device 40 (25° C.). The adhesion of water to the sensor surface 31a and the undesirable response of the sensor element 31 to the water can be suppressed thereby.

Even when condensation undesirably occurs in the interior of the enclosure 34, water can be prevented from adhering to the sensor surface 31a by disposing the sensor element 31 so that the sensor surface 31a faces the direction of gravity (downward) as shown in FIG. 1. By providing the heating device 80 in the direction of gravity of the enclosure 34 (below the enclosure 34) as in FIG. 1, the water that is undesirably formed by condensation can be efficiently evaporated. The heating device 80 may be located at the side of the enclosure 34 at which the sensor element 31 is located. Condensation on the sensor surface 31a can be prevented.

When a graphene sensor is used as the sensor element 31, it is favorable to include a switching device 60 and a fourth pipe 14 through which reference air is conveyed. Air that is proximate to the specimen atmosphere is drawn into the fourth pipe 14 through a second collection port 14a. The first pipe 11, the fourth pipe 14, and the mixing device 20 are connected to the switching device 60. For example, a three-way valve can be used as the switching device 60. The switching device 60 is configured to switch between a reference phase in which the first pipe 11 and the mixing device 20 are cut off and the fourth pipe 14 and the mixing device 20 are connected, and a detection phase in which the fourth pipe 14 and the mixing device 20 are cut off and the first pipe 11 and the mixing device 20 are connected.

The target substance in the specimen atmosphere can be detected using the relative change of the electrical characteristic (e.g., the current) of the sensor element 31 of the detection phase with respect to the electrical characteristic (e.g., the current) of the sensor element 31 of the reference phase.

The fourth pipe 14 and the switching device 60 may not be provided if the sensor element can easily determine the presence or absence of the target substance based on the absolute value of the electrical characteristic or the like. For example, when a sensor element that includes a metal-oxide film at the sensor surface is used, the target substance can be detected based on the resistance value of the metal-oxide film, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A gas sensor system, comprising:
   a first pipe through which a specimen atmosphere is conveyed;

a source of reference air is connected a fourth pipe through which the reference air is conveyed,
   a switching device connected to the first pipe and the fourth pipe and configured to switch between a reference phase in which the first pipe is cut off and the fourth pipe and an inlet to a mixing device are connected, and a detection phase in which the fourth pipe and the inlet to the mixing device are cut off and the first pipe and the mixing device are connected;
   a humidifying device connected to a second pipe through which humidified air from the humidifying device is conveyed to a mixing device, the humidified air being hotter and more humid than the specimen atmosphere, the humidified air having a lower water vapor pressure than a saturation water vapor pressure;
   the mixing device is connected the switching device and humidifying device, the mixing device is configured to mix the specimen atmosphere and the humidified air so that a water vapor pressure of mixed air of the specimen atmosphere and the humidified air is less than a saturation water vapor pressure; the mixed air being conveyed through the mixing device outlet via a third pipe;
   a cooling device connected to the mixing device via the third pipe and configured to cooling the mixed air conveyed through the third pipe so that the water vapor pressure of the mixed air becomes the saturation water vapor pressure;
   a chemical sensor device connected with the third pipe, the chemical sensor device including a sensor surface to which the mixed air cooled by the cooling device is supplied; and
   a control device configured to switch between the reference phase in which the first pipe and the mixing device are cut off and the fourth pipe and the mixing device are connected, and a detection phase in which the fourth pipe and the mixing device are cut off and the first pipe and the mixing device are connected.

2. The system according to claim 1, wherein the sensor surface includes graphene.

3. The system according to claim 2, wherein the sensor surface further includes a probe molecule formed at the graphene.

4. The system according to claim 1, further comprising: a first temperature-humidity sensor measuring a temperature and a humidity of the specimen atmosphere; and the control device controlling a mixing ratio of the specimen atmosphere and the humidified air in the mixing device based on a measured value of the first temperature-humidity sensor.

5. The system according to claim 4, further comprising: a second temperature-humidity sensor measuring the temperature and the humidity of the humidified air, the control device controlling the mixing ratio based on a measured value of the second temperature-humidity sensor.

6. The system according to claim 4, further comprising: a third temperature-humidity sensor measuring a temperature and a humidity of the mixed air before being cooled by the cooling device, the control device controlling the mixing ratio based on a measured value of the third temperature-humidity sensor.

7. The system according to claim 1, further comprising: a heating device heating the chemical sensor device.

8. The system according to claim 1, wherein a first distance along the third pipe between the cooling device and the chemical sensor device is less than a second distance along the third pipe between the cooling device and the mixing device.

9. The system according to claim 1, wherein the chemical sensor device further includes an enclosure, the sensor surface is housed in an interior of the enclosure, and the third pipe communicates with the interior of the enclosure.

10. The system according to claim 9, further comprising: an exhaust pipe communicating with the interior of the enclosure.

11. The system according to claim 9, wherein the sensor surface faces a direction of gravity in the interior of the enclosure.

\* \* \* \* \*